United States Patent
Tilke et al.

(10) Patent No.: US 7,001,806 B2
(45) Date of Patent: Feb. 21, 2006

(54) SEMICONDUCTOR STRUCTURE WITH INCREASED BREAKDOWN VOLTAGE AND METHOD FOR PRODUCING THE SEMICONDUCTOR STRUCTURE

(75) Inventors: Armin Tilke, Dresden (DE); Wolfgang Klein, Zorneding (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/780,276

(22) Filed: Feb. 17, 2004

(65) Prior Publication Data

US 2004/0227210 A1 Nov. 18, 2004

(30) Foreign Application Priority Data

Feb. 17, 2003 (DE) ................. 103 06 597

(51) Int. Cl.
*H01L 21/8238* (2006.01)

(52) U.S. Cl. ............... 438/202; 438/203; 438/204; 438/205; 438/309; 438/313; 438/322; 438/323; 438/340

(58) Field of Classification Search ........ 438/202–205, 438/309, 313, 322, 323, 340; 257/552–555
See application file for complete search history.

(56) References Cited

U.S. PATENT DOCUMENTS 5,121,185 A 6/1992 Tamba et al.
2002/0158308 A1 10/2002 Huber et al.

FOREIGN PATENT DOCUMENTS

DE 100 44 838 A1 4/2002
JP 61-194845 * 8/1986

OTHER PUBLICATIONS

O, Kenneth K., and Brad W. Scharf, "Effects of Buried Layer Geometry on Characteristics of Double Polysilicon Bipolar Transistors," IEEE Electron Device Letters, vol., 19, No. 5, © May 1998, (3 pages).

* cited by examiner

*Primary Examiner*—Thien F. Tran
(74) *Attorney, Agent, or Firm*—Maginot Moore & Beck

(57) ABSTRACT

A semiconductor structure comprises a buried first semiconductor layer of a first doping type, a second semiconductor layer of the first doping type on the buried semiconductor layer, which is less doped than the buried first semiconductor layer, a semiconductor area of a second doping type on the second semiconductor layer, so that a pn junction is formed between the semiconductor area and the second semiconductor layer, and a recess present below the semiconductor area in the buried first semiconductor layer, which comprises a semiconductor material of the first doping type, which can be less doped than the buried first semiconductor layer and has a larger distance to the semiconductor area of the second doping type on the second semiconductor layer, such that the breakdown voltage across the pn junction is higher than if the recess were not provided. Thereby, it is achieved that both a semiconductor structure with a desired breakdown voltage as well as a further semiconductor structure without this recess can be generated in the buried first semiconductor layer with optimized HF properties.

16 Claims, 8 Drawing Sheets

FIG 5
A)
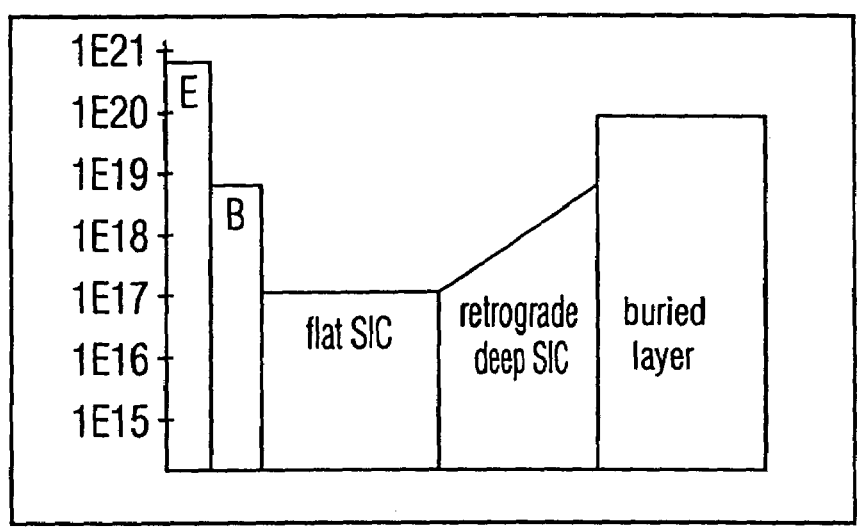
B)
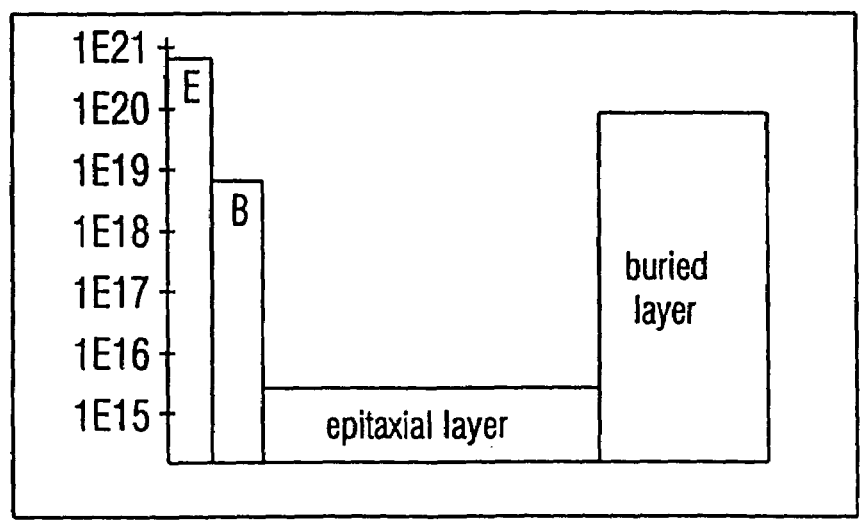

FIG 6
A)
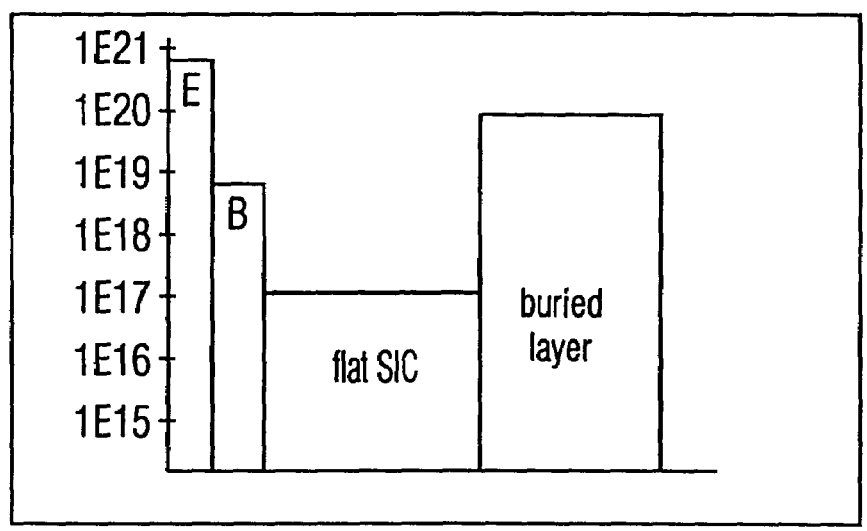
B)
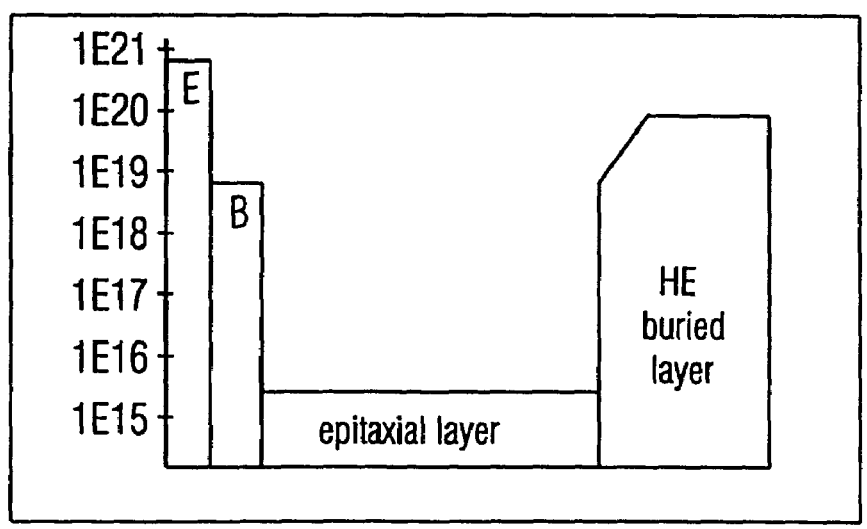

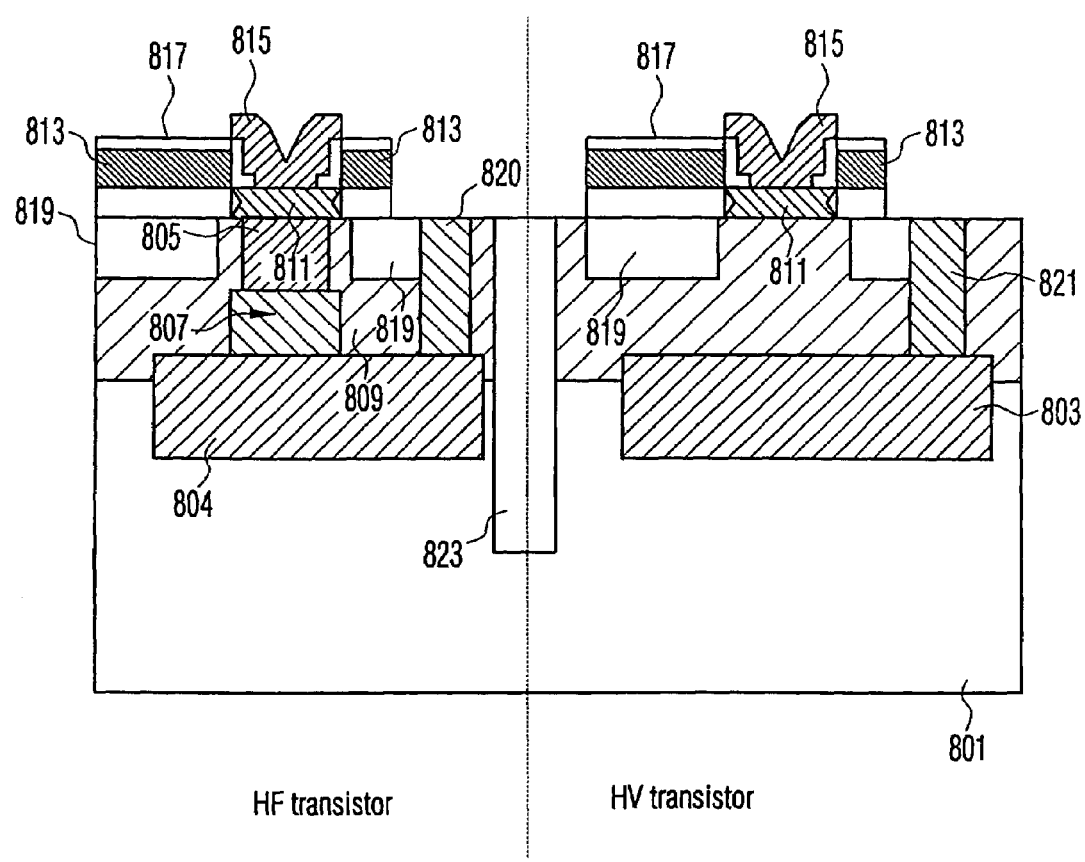

SEMICONDUCTOR STRUCTURE WITH INCREASED BREAKDOWN VOLTAGE AND METHOD FOR PRODUCING THE SEMICONDUCTOR STRUCTURE

BACKGROUND OF THE INVENTION

1. Field of the Invention

The present invention relates to a semiconductor structure with increased breakdown voltage across a pn junction, which the semiconductor structure comprises.

2. Description of the Prior Art

One of the main demands on semiconductor structures in modern microelectronic circuits is that the semiconductor structures ideally have a desired breakdown strength matched with a good frequency characteristic, such as a high cutoff frequency, for a respective application.

Particularly in modern BiCMOS technologies, where a collector of a bipolar transistor is laterally connected via a heavily doped subcollector (buried layer), which is buried by a collector epitaxy, often mutually exclusive demands are made on a bipolar process module. On the one hand, an integration of a bipolar transistor, which is as fast as possible, is required for low operating voltages, on the other hand, usually, bipolar transistors are required, which have a high breakdown voltage but only need to achieve a lower high frequency performance. For a fast transistor (HF), a collector epitaxial layer should be as thin as possible, so that a collector terminal resistor as well as the minority charge carrier in the collector becomes low and thus the RF performance high. For the transistor with a high breakdown voltage (HV), however, the collector epitaxy should be thick, so that the base collector space charge zone can extend widely and thus the required breakdown voltage is achieved. For that reason, a doping of the collector epitaxy is low, for example $<1\ E\ 16\ cm^{-3}$.

Normally, both the thickness and the dopant of the epitaxial layer (collector epitaxy) is determined such that the required breakdown voltage for the HV transistor is ensured. Since the low doping for the HF transistor does not allow sufficiently high collector currents and thus the HF performance suffers as well, since a maximum cutoff frequency $f_t$ (transit frequency) depends in a linear way on a maximum collector current $I_c$, where the so-called Kirk effect occurs, often a so-called SIC (SIC=selectively implanted collector) is implanted in a conventional HF transistor.

In FIG. 8, a conventional integration of an HF and an HV bipolar transistor is illustrated. Heavily doped subcollectors 803 and 804 of the HV and HF transistor (buried layer) are disposed on a substrate 801. The HF transistor disposed on the left hand side of the dotted line further comprises a first SIC 805 as well as a second SIC 807. Both the first SIC and the second SIC are buried in a collector epitaxy 809. Further, a base 811 is disposed on the first SIC 805, which can, for example, be connected to a wiring level with the help of a base terminal layer 813. An emitter layer 815 is disposed on the base 811, which is contacted via an emitter contact. Further, an isolation layer 817 as well as an insulating spacer in the emitter window are disposed on the base terminal layer 813. Both layers serve for the electrical insulation between the emitter and the base terminal. Oxide layers 819, for example, are further formed below the base terminal layer. The subcollector 804 can be contacted from the top via a further terminal 820. The buried layers of the individual transistors are insulated against one another by a deep trench 823. However, they can also be insulated against one another by a pn insulation.

In contrast to the HF transistor, the HV transistor, which is disposed on the right hand side of the dotted line, has no first and no second SIC. Thereby, the subcollector 803 can for example be provided with a voltage via a further terminal 821. If the HF and HV transistors illustrated in FIG. 8 are, for example, npn transistors, the subcollector 803 is, for example heavily n doped, while the collector epitaxial layer 809 is less n doped. Thereby, the second SIC 807 and the first SIC 805 are also n doped, wherein a doping concentration of the first and the second SIC is higher than of the collector epitaxial layer and lower than of the subcollector.

An implantation of an SIC leads to a volume doping (about $1\ E\ 17\ cm^{-3}$) which is increased in comparison to the dopant of the collector epitaxy (epidoping). When reaching the breakdown voltage, however, the base collector space charge zone of the HF transistor does not extend the buried subcollector 803, due to the high epithickness and the doping increased by the SIC implantation. Thus, the collector current has to flow through the relatively high impedance area of the SIC between the end of the space charge zone and the beginning of the subcollector. For that reason, this area is often doped by a second SIC implantation 807, as it is illustrated in FIG. 8, which can then be optimized as retrograde profile. A disadvantage is, that the HF performance of the transistor is affected thereby, since, on the one hand, the doping and thus a conductivity of the SIC is significantly lower in comparison to the subcollector. On the other hand, the SIC implantation cannot nearly achieve a dopant profile as high as by an epitaxy, so that a collector resistance is higher than with a minimal possible epithickness. All in all, the HF transistor does not achieve the best possible performance, which would be possible in this technology generation, since, for example, the already mentioned increased collector resistance as well as the higher minority charge carrier storage lower the cutoff frequency of the HF transistor.

It is another disadvantage of the approach illustrated in FIG. 8 that the HF properties of the HF transistor starting from the HV transistor, whose collector epitaxy is optimally designed for increasing the breakdown voltage, are to be improved by an introduction of one or several SICs, respectively. Since the HF properties of the HV transistor are of secondary importance in comparison to the demand on the breakdown voltage when forming the collector epitaxy 809, the collector epitaxy has to be thick, and therefore, the properties of the HF transistor formed in this epitaxial layer, have to be improved by introducing one or several SICs 805 and 807. This leads to a rise in costs of the production process, since the first and the second SIC have to be formed, for example, by an implantation of a dopant.

It is another disadvantage of the approach illustrated in FIG. 8, that a dissipation power of the HF transistor is increased due to the SICs 805 and 807, as well as the already mentioned increased collector resistance. If a microelectronic circuit comprises a plurality of HF transistors, as illustrated in FIG. 8, this leads to a significant rise in power consumption as well as possibly a heat built up, whereby the costs of the operation of such a circuit are increased.

Another disadvantage of the transistors according to the prior art illustrated in FIG. 8 is, that due to the thickness of the collector epitaxy 809 required for achieving a predetermined breakdown voltage, the dimensions, for example in vertical direction, of a transistor produced in such a way increase, since the thickness of the collector epitaxy 809 has to be chosen large for achieving a high breakdown voltage strength. The epitaxy thickness depends on the breakdown voltage of the HV transistor. This results in another disadvantage, that with larger thickness of the collector epitaxial layer 809 for achieving a higher breakdown voltage, the HF performance of the HF transistor is inevitably decreased, since the SICs 805 and 807 inevitably have to be longer, or a third SIC is inserted, whereby the already mentioned collector resistance rises further.

In the document of K. O. Kenneth and B. W. Scharf: "Effects of Buried Layer Geometry on Characteristics of Double Polysilicon Bipolar Transistor" a bipolar transistor with a higher breakdown voltage is described, where a subcollector consists of segmented parts.

SUMMARY OF THE INVENTION

It is the object of the present invention to provide an efficient concept for increasing a breakdown voltage of a semiconductor structure.

In accordance with a first aspect, the present invention provides a semiconductor structure having a buried first semiconductor layer of a first doping type, a second semiconductor layer of the first doping type on the buried semiconductor layer, which is less doped than the buried first semiconductor layer, a semiconductor area of a second doping type on the second semiconductor layer, so that a pn junction is formed between the semiconductor area and the second semiconductor layer, and a recess present in the buried first semiconductor layer below the semiconductor area, which contains a semiconductor material of the first doping type, which lies deeper in the substrate than the buried first semiconductor layer, such that the breakdown voltage across the pn junction is higher compared to if the recess were not provided.

In accordance with a second aspect, the present invention provides a method for producing an inventive semiconductor structure, by providing the buried first semiconductor layer with a recess formed therein, generating the further semiconductor area in the recess, introducing the semiconductor material of the first doping type into the recess, wherein after the step of introducing the semiconductor material lies deeper in the substrate than the buried first semiconductor layer, generating the second semiconductor layer on the buried first semiconductor layer, which is less doped than the buried first semiconductor layer, and generating the semiconductor area on the second semiconductor layer.

The present invention is based on the knowledge that it is possible to simultaneously form a semiconductor structure with optimized HF properties and a semiconductor structure with increased breakdown voltage in an integrated circuit, when the thickness of the weakly doped semiconductor layer (epilayer), which is connected via a buried heavily doped layer, is designed for optimized HF properties, and a recess is provided in the buried heavily doped layer for the semiconductor structure with increased breakdown voltage. In this recess, for example, a second heavily doped layer can be generated, which lies deeper in the substrate than the first. Thus, by a recess, a longer distance results between buried heavily doped layer and the oppositely doped semiconductor area across the weakly doped epilayer, so that the breakdown voltage is increased. The recess of the heavily doped buried layer represents an area where the buried heavily doped layer is replaced by a semiconductor area with less doping, below which, again, a second heavily doped layer can lie. This area can be formed by a recess only in the upper side of the buried layer, where a semiconductor material is disposed, which has a doping corresponding to the epilayer.

Preferably, however, the recess is provided fully penetrating the buried layer, wherein a high-energy implantation of the doping density, which can be lower than the one of the buried layer, is performed at least in the bottom area of the recess. Preferably, the high energy implant would also be doped very heavily. High-energy implantation, however, means very long process times and further process problems, which is why, in practice, it can only be doped less than in the conventionally buried layer.

This invention is suitable for the application in all semiconductor elements, where a pn junction with increased breakdown voltage is to be implemented, such as respective diodes or bipolar transistors.

The invention is particularly advantageously applicable when an HF transistor and an HV transistor are to be integrated simultaneously on the substrate. The orientation of the collector epithickness is then performed at the HF transistor and not at the HV transistor. Thereby, an optimum HF performance of the HV transistor is achieved, with a simultaneously sufficient and freely adjustable breakdown voltage of the HV transistor. At the same time, different breakdown voltages can be set for different HV transistors by different widths of recesses by simple layout measurements.

It is another advantage of the present invention that two transistors can be integrated simultaneously, one of which can be optimized with regard to HF performance and the other one can be optimized separately with regard to the breakdown voltage. In the conventional method, either the HF performance of the HF transistor suffers, or the breakdown voltage of the HV transistor is too low.

It is another advantage off the present invention that the dimensions of the inventive semiconductor structure are smaller in comparison to the dimensions of the structure according to the prior art discussed in FIG. 8, since a thickness of the second semiconductor layer, which can, for example, be a collector epitaxial layer, is not chosen based on the breakdown voltages of the HV transistor but based on the HF performance of the HF transistor, so that the thickness of the second semiconductor layer is smaller, which leads to a further reduction of production costs.

It is another advantage of the inventive semiconductor structure that it enables HF transistors with optimized HF properties and HV transistors with a sufficient breakdown voltage strength integrated in one circuit.

Another advantage of the present invention is a reduction of production costs of the inventive semiconductor structure, since less production steps as well as thinner layers (collector epilayer) are sufficient for achieving an optimum HF performance of the HF transistors as well as a sufficient breakdown voltage of the HV transistors. The integration in the BiCMOS process can, for example, be significantly simplified, since the SIC of the HF transistor can be implemented flatter due to the low collector epitaxial layer thickness, and still provides a good contact to the heavily doped buried layer. Thereby, the cover layers across the CMOS areas for masking this SIC implant can be kept thinner, which, on the one hand, reduces the costs of the deposits and, on the other hand, significantly eases the residual-free removal of these layers.

It is another advantage of the present invention, that several bipolar transistors with different voltage can be formed, for example, on a substrate, for example by a simple variation of a width of the recess of the buried first semiconductor layer. Thereby, it is achieved that different breakdown strengths can be obtained merely by a layout modification and thus by a variation of a production step, so that further additional process steps are not required, whereby the production process is flexible and the unit costs are low.

The present invention is particularly advantageous in BiCMOS technologies, since through the benefit of the higher possible HF performance of the HF transistors, BiCMOS products can also have a better HF performance and thus an improved competitiveness. This is particularly interesting in applications as mobile radio, WLAN, etc. With an integration of, for example, two HV transistors for different breakdown voltages, the invention can save one lithography level.

BRIEF DESCRIPTION OF THE DRAWINGS

These and other objects and features of the present invention will become clear from the following description taken in conjunction with the accompanying drawings, in which:

FIG. 5 is dopant concentrations of an (a) HF transistor and an (b) HV transistor in a conventional transistor integration;

FIG. 6 is dopant concentrations of an (a) HF transistor and an (b) HV transistor according to the present invention;

FIG. 8 is conventional transistor integration.

DESCRIPTION OF THE PREFERRED EMBODIMENTS

Figure 1:
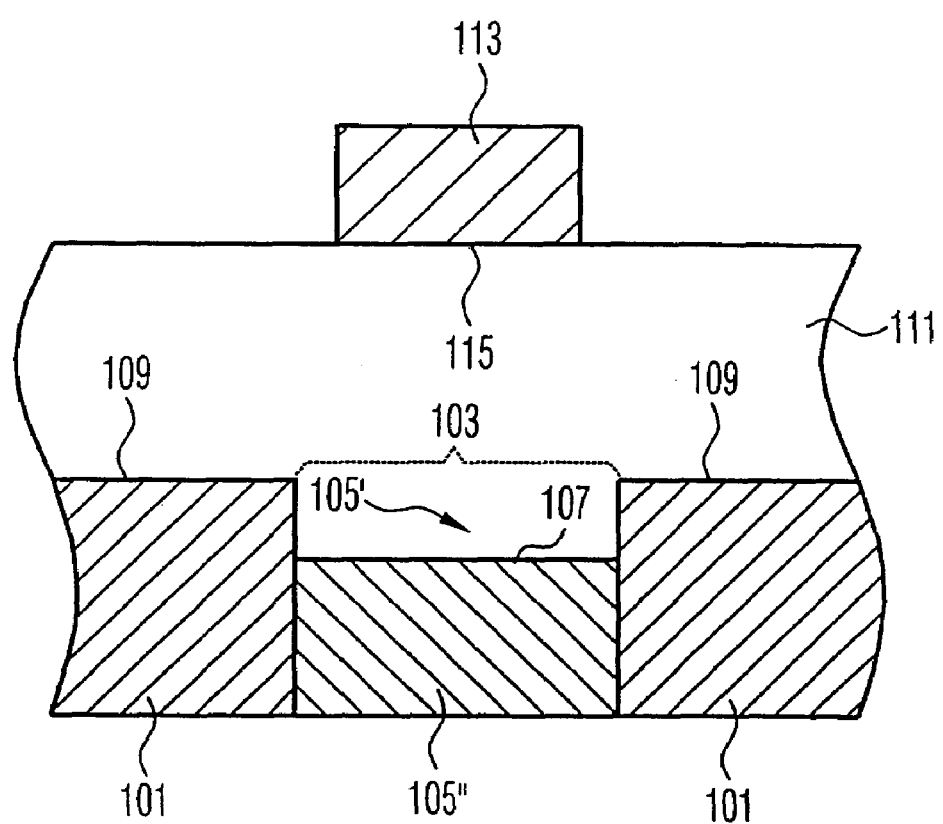
FIG. 1 is a first embodiment of a semiconductor structure according to the present invention.

FIG. 1 shows a first embodiment of a semiconductor structure according to the present invention. The semiconductor structure comprises a heavily doped buried first semiconductor layer 101 of a first doping type, wherein a recess 103 is formed. On a first surface 109 of the buried first semiconductor layer 101, as well as on the top surface 107 of the further semiconductor area 105", a second semiconductor layer 111 is formed, which is a weakly doped layer of the first doping type, which can, for example, be an epi layer. The second weakly doped semiconductor layer extends into a portion 105' of the recess 103. Further, another semiconductor area 105" of the first doping type is disposed in the recess 103, whose doping density lies preferably between the epi layer 111 and the buried layer 101, and which preferably lies deeper than the buried first semiconductor layer 101. The further semiconductor area 105" further comprises a top surface 107.

A semiconductor area 113 with a bottom surface 115 is disposed on the second semiconductor layer 111. Thereby, the semiconductor area 113 is of a second doping type, so that between the semiconductor area 113 and the second semiconductor layer 111, a pn junction is implemented. Further, the semiconductor area 113 is disposed across the recess 103, wherein the vertical distance from the top surface 109 of the buried first semiconductor layer from the bottom surface 115 of the semiconductor area 113 is lower than the vertical distance of the top surface 107 of the further semiconductor area 105" from the bottom surface 115.

In the following, reference is made to a mode of operation of the semiconductor structure illustrated in FIG. 1. Here, it is always assumed that the first doping type is an n doping, and the second doping type a p doping. The subsequent statements, however, apply also to a semiconductor structure where the first doping type is a p doping and the second doping type is an n doping.

The semiconductor structure shown in FIG. 1 has an optimized breakdown voltage. Due to the low thickness of the semiconductor layer 111, a second semiconductor structure with optimized HF properties can be generated simultaneously. The breakdown voltage is mainly determined by a distance of the top surface 107 of the further semiconductor area 105" to the bottom surface 115 of the semiconductor area 113, by a distance of the surfaces 109 and 115 to one another, by the width of the recess 103, as well as by the respective doping concentration of the respective semiconductor areas and layers. If, for example, the semiconductor structure shown in FIG. 1 is a bipolar transistor, according to the above made assumption, the first semiconductor area 113 is a p doped base, and the second semiconductor layer 111 as well as the buried first semiconductor layer 101 form an n doped collector of the bipolar transistor. Thereby, the doping of the second semiconductor layer 111 is lower than the one of the buried first semiconductor layer 101.

In order to obtain a sufficient breakdown voltage, the structure illustrated in FIG. 1 has the inventive recess 103. Thereby, as has already been mentioned, the top surface 107 of the further semiconductor area 105" formed in the recess 103 is further apart from the bottom surface 115 of the semiconductor area 113 (base) than the top surface 109 of the buried first semiconductor layer 101 (subcollector). Thereby, the breakdown voltage is increased, since, for example, the base space charge zone can now expand widely. Thereby, the further semiconductor area 105", which is disposed in the recess 103, is also n doped. The doping concentration of the further semiconductor area 105" can, for example, be lower than the one of the buried first semiconductor layer 101. It is also possible that the doping concentration of the further semiconductor area 105" as well as the doping concentration of the buried first semiconductor layer 101 are equal, since in this case, the breakdown voltage can be realized, for example, by an even larger distance of the top surface 107 of the further semiconductor area 105" to the base 113. Independent of the doping concentration of the second semiconductor area, the breakdown voltage can further be varied by a variation of a width of the recess 103 and thus the further semiconductor area 105" disposed in the recess 103, since the breakdown voltage increases with increasing width of the recess 103, and, vice versa, the breakdown voltage also decreases with decreasing width of the recess 103.

In the embodiment illustrated in FIG. 1, the recess 103 is formed such that it separates the buried first semiconductor layer 101. It should, however, be noted that the recess 103 does not have to separate the buried first semiconductor layer 101. It is also possible that the recess 103 only has a low depth, so that the buried first semiconductor layer 101 is continuous, so that the further semiconductor area 105" is either not formed at all or on an area of the buried first semiconductor layer 101, across which the recess 103 is formed, so that with, for example, a low doping concentration of the further semiconductor area 105" as well as a larger distance of the surface 107 of the further semiconductor area 105" to the base 113, as it is the case with the top surface 109 of the buried first semiconductor layer 101, a desired breakdown voltage can also be obtained. Typical values for HV transistors which have a construction illustrated in FIG. 1 are at >4 V.

It should be noted that setting the breakdown voltage can also be obtained when the top surface 107 of the further semiconductor area 105" as well as the top surface 109 of the buried first semiconductor layer 101 have, for example, the same distance to the bottom surface 115 of the semiconductor area 113. In this case, the lower doping density or concentration of the further semiconductor area 105" contributes significantly to an increase of the breakdown voltage.

According to the invention, the desired breakdown properties as well as the resulting HF performance of the inventive semiconductor structure can be obtained, for example, by a variation of the width of the recess 103, the doping concentration of the buried first semiconductor layer 101 as well as the further semiconductor area 105" as well as, for example, the ratio of a distance of the top surface 109 of the buried first semiconductor layer 101 as well as the top surface 107 of the further semiconductor area 105" to the bottom surface 115 of the semiconductor area 113.

Figure 2:
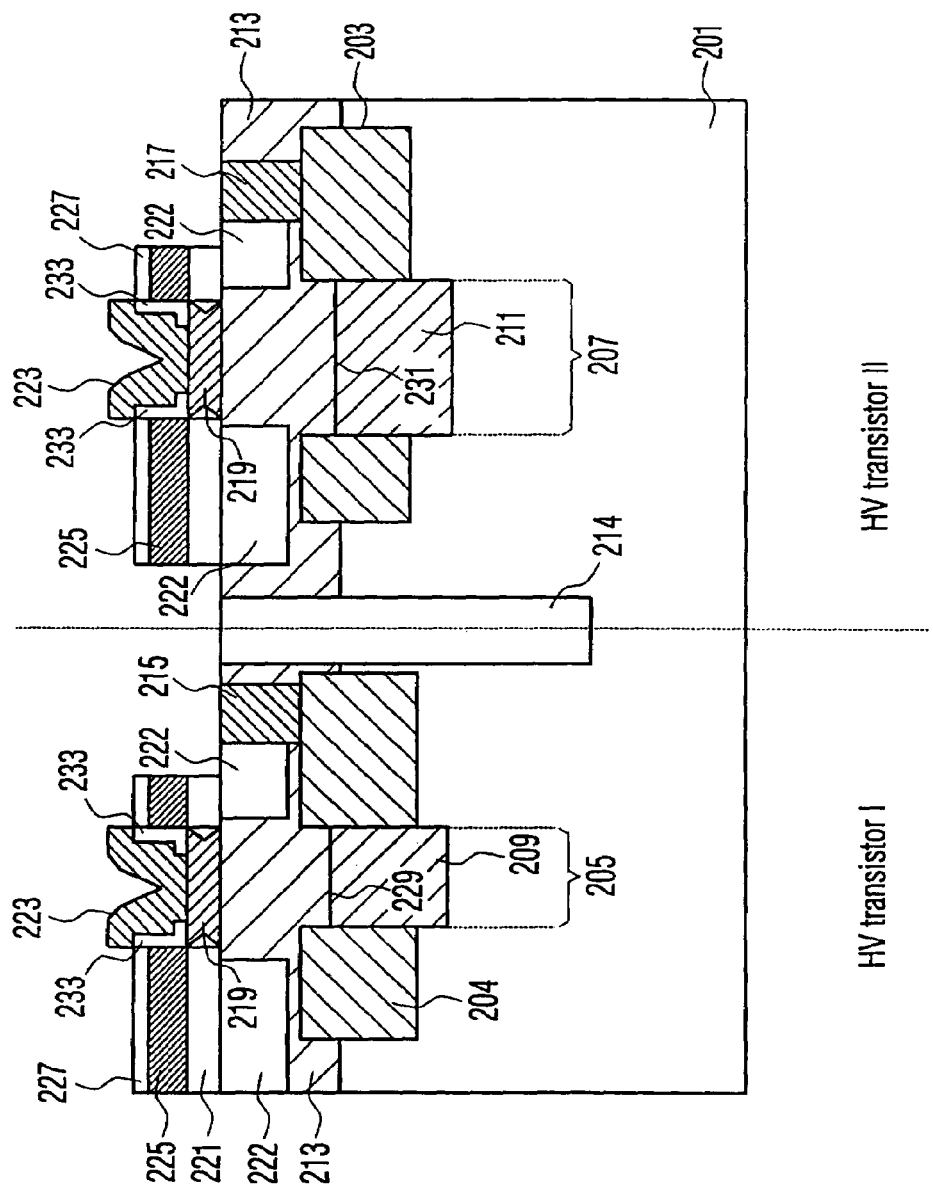
FIG. 2 is a further embodiment of a semiconductor structure according to the present invention.

FIG. 2 shows a further embodiment of a semiconductor structure according to the present invention. Thereby, the transistor illustrated on the left hand side of the vertical line in FIG. 2 is a HV transistor I, and the transistor disposed on the right hand side of the line is a HV transistor II. Both the HV transistor I and the HV transistor II together form the inventive semiconductor structure.

The semiconductor structure illustrated in FIG. 2 has a substrate 201, which can be, for example, a weakly doped semiconductor substrate, such as a p substrate. A buried first semiconductor layer 203 and 204 is respectively disposed on the substrate 201. The buried first semiconductor layer 204 comprises a first recess 205, and the buried first semiconductor layer 203 has a second recess 207. Both recesses 205 and 207 acre spaced apart from one another. A further semiconductor area 209 is formed in the first recess 205 of the buried first semiconductor layer 204. A further semiconductor area 211 is disposed in the second recess 207. Thereby, the further semiconductor area 209 has a top surface 229 and the further semiconductor area 211 has a top surface 231. A second semiconductor layer 213 is formed on the buried first semiconductor layers 203 and 204, as well as on the further semiconductor area 209 and the further semiconductor area 211. Thereby, the second semiconductor layer is separated by a deep trench isolation 214, which also separates the buried layers of the HF and HV transistor.

The further semiconductor area 209, the further semiconductor area 211, the respective buried first semiconductor layer 203 and 204 as well as the second semiconductor layer 213 are, for example, n doped, wherein the respective doping concentrations can be different. The second semiconductor layer 213 is, for example, a collector of an npn bipolar transistor, and the respective buried first semiconductor layers 203 and 204 are a subcollector (buried layer) of the respective bipolar transistor. In the embodiment illustrated in FIG. 2, the further semiconductor area 209 as well as the further semiconductor area 211 extend into the substrate 201 without separating the substrate 201. Further, the respective buried first semiconductor layers 204 and 203 comprise a first terminal 215 as well as second terminal 217, wherein both terminals are lead through the second semiconductor layer 213 towards the top and serve for contacting the respective buried first semiconductor layer 204 and 203. A base 219 is disposed across the recess 205 as well as across the recess 207 on the second semiconductor layer 213 or in it. On the left and right beside the respective base 219, further isolation layers 221 and 222 (e.g. shallow trench isolation) are formed and extend partly towards the bottom into the second semiconductor layer 213.

A third semiconductor area 223 (emitter, e.g. n doped polysilicon) is respectively disposed on the respective base 219, which can be contacted across an emitter contact. The third semiconductor area can be, for example, an n doped polysilicon layer. For connecting the respective base 219, further, a base terminal layer 225 is disposed on the further substrate layers 221 and 222. Further, on the respective base terminal layer 225, an isolation layer 227 is disposed. This layer serves for isolating the base and the emitter polysilicon, respectively, from one another. Thereby, the respective emitter 223 is lead towards the top, so that it extends through the respective isolation layer 227 as well as through the respective base terminal layer 225 towards the respective base 219. Thus, two bipolar transistors (HV transistor I and HV transistor II) are illustrated in FIG. 2, which are disposed on the left and right, respectively, of the dotted line illustrated in FIG. 2.

In the respective emitter window, a spacer 233 is disposed, which has an L shape in this embodiment, but can have an arbitrary shape, which serves for isolation.

For clarity reasons, the passivation layers are not illustrated in the embodiment—they would lie on the drawn structures.

In the following, reference will be made to the mode of operation and the properties of the inventive semiconductor structure illustrated in FIG. 2.

In FIG. 2, two HV transistors are integrated on the substrate 201, wherein the HV transistor I and the HV transistor II are distinguished by a different breakdown voltage due to different widths of the respective recess 205 and 207 (window widths) in the buried first semiconductor layer 203 (subcollector).

By different window widths of the respective recesses 205 and 207 as well as by a respective different distance of the respective top surface 229 and 231 to the respective base 219, the respective HV transistor I as well as the HV transistor II are distinguished by different breakdown voltages. Thereby, preferably, the buried first semiconductor layer (subcollector) is heavily n doped, and the second semiconductor layer 213 (collector) is, for example, doped less than the subcollector 203. The further semiconductor area 209 and the further semiconductor area 211 have, for example, an equal doping concentration and are n doped, wherein the doping concentration of the further semiconductor areas 209 and 211 can be lower than the one of the buried first semiconductor layer 203 and higher than the one of the second semiconductor layer 213. Thus, according to the invention, respectively different transistors with a different breakdown voltage as well as a different HF performance can be integrated on the substrate 201, wherein the transistor properties are obtained, for example, by a variation of the respective window widths of the recesses 205 and 207.

As has already been mentioned, the further semiconductor area 209 as well as the further semiconductor area 211 extend into the substrate 201. In this way, the respective transistor properties can for example be set by a variation of the respective depth of the respective further semiconductor area 209 and 211, in addition to a variation of the window width. The respective further semiconductor areas 209 and 211 can be realized, for example, by high-energy ion implantation into the substrate 201.

Figure 3:
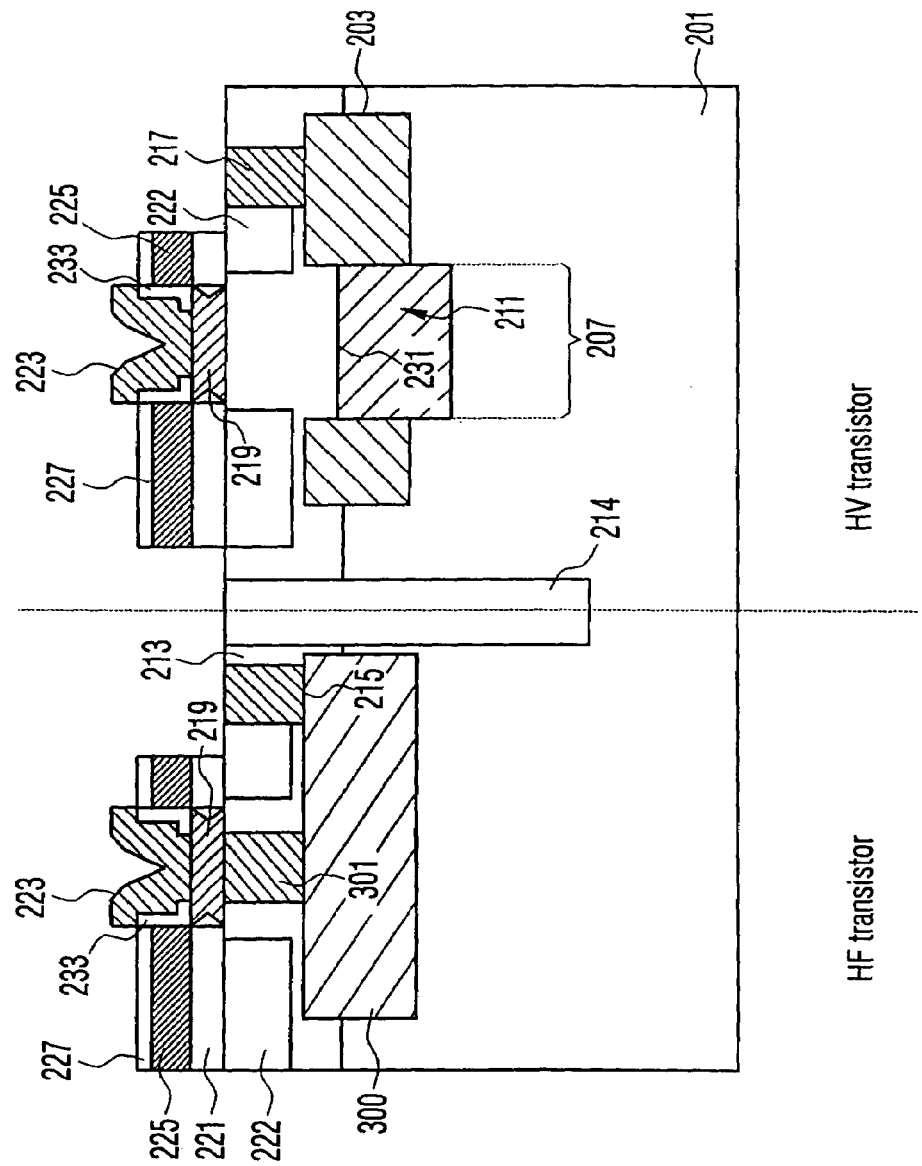
FIG. 3 is a further embodiment of a semiconductor structure according to the present invention.

In FIG. 3, an integration of an HF transistor and for example, a HV transistor already known from FIG. 2 (such as HV transistor II) is shown, wherein the transistors are respectively on the left and right of the vertical line illustrated in FIG. 3.

In the following description of the preferred embodiments, elements, which have already been explained with reference to FIG. 2, are provided with the same reference numbers. No repeated description of these elements is given. Further, in the figures, same elements are provided with same reference numbers.

The HF transistor comprises an SIC 301, which connects the base 219 to a buried first semiconductor layer 300. Thereby, the thickness of the second semiconductor layer 213, which can for example be an epitaxial layer, is adapted to the HF transistor disposed on the left of the dotted line, so that the HF transistor, for example, has optimum HF properties. To obtain a higher breakdown voltage at the HF transistor, the further semiconductor area 211 (second subcollector) is disposed in the recess 207, as has already been discussed in connection with the embodiment illustrated in FIG. 2. Thereby, a portion of the second semiconductor layer 213 is disposed across the further semiconductor area 211 of the first semiconductor layer 300, such that a portion of the second semiconductor layer 213 is disposed in between. Thereby, the second recess has a predetermined width as well as a predetermined distance to the semiconductor structure 219, so that, according to the invention, the HV transistor can be integrated together with a conventional HF transistor on a substrate.

Preferably, a thickness of the second semiconductor layer (collector epitaxy) is optimally adapted to the demands with regard to the HF performance of the HF transistor. In the collector area of the HV transistor, for example, no subcollector is implanted during a production process, but a deeper second subcollector (further semiconductor area 211) is locally implanted either before or after growing the second semiconductor layer (collector epitaxy) by, for example, a high energy implantation in the recess 207, which is adapted to the demands of the HV transistor. Therefore, before the collector epitaxy, the implantation requires an additional lithography level and can, for example, be performed with arsenic. Due to an extended process control due to the lithography level, both the HF transistor and the HV transistor can be optimally adapted to the respective demands in a simple way according to the invention.

Figure 4:
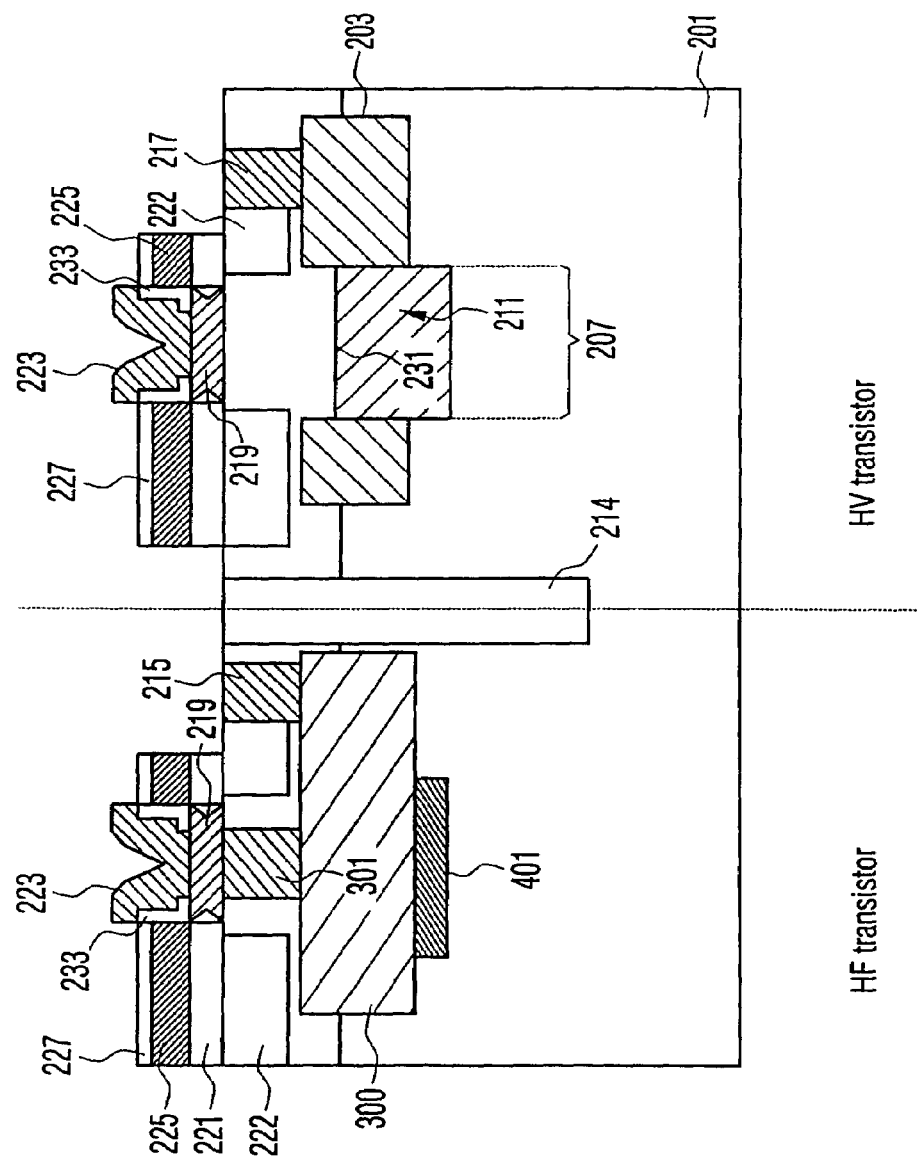
FIG. 4 is a further embodiment of a semiconductor structure according to the present invention.

FIG. 4 shows a further embodiment of a semiconductor structure according to the present invention.

In difference to the embodiment illustrated in FIG. 3, the semiconductor structure illustrated in FIG. 4 has a bottom semiconductor area 401, which is disposed below the buried first semiconductor layer 300 and extends into the substrate 201. The bottom semiconductor area 401 is further disposed below the base 219 of the HF transistor which is disposed on the left of the vertically drawn line. The third semiconductor area 401 has, for example, a doping concentration, which is similar to the doping concentration of the further semiconductor area 211, wherein both the bottom semiconductor area 401 and the further semiconductor area 211 are doped with the same doping type, which can, for example, be an n doping.

The embodiment illustrated in FIG. 4 explains the inventive concept for the integration of an HF and an HV bipolar transistor with two subcollectors. The thickness of the second semiconductor layer 213 (collector epitaxial layer) is adapted to the HF transistor, as has already been discussed in connection with the embodiment illustrated in FIG. 3. In contrast to the production method underlying the semiconductor structure illustrated in FIG. 3, no separate lithography layer is required in the production of the inventive semiconductor structure illustrated in FIG. 4, whereby the production costs are further reduced. The high-energy implantation after the epitaxy for generating the semiconductor area 211 can be performed by an implantation (e.g. phosphor) by a 'bipolar open' lithography required in the BiCMOS technology. Thereby, the deeper subcollector 211 is also implanted into the HF transistor, and no separate lithography level is required. When an implantation depth of the deeper subcollector is significantly large, the HF transistor is not influenced by this implantation, since a dispersion of the implantation into the surface near areas of the epitaxial layer is low. Therefore, this inventive concept is particularly applicable for different breakdown voltages of the high frequency transistor (about 1.5–2.5 volt) and the HV transistor (about 3–6 Volt), as they are mostly found in modern bipolar and BiCMOS technologies. Since the deeper subcollector 211 is often doped less than the buried layer 203, in the HF transistor without recess 207, the doping of the deeper subcollector is often covered in the area of the buried layer 203 by the same. Thus, in the HF transistor, only the bottom area 401 of the deeper subcollector extends into the substrate.

The collector resistance of the HV transistor is possibly slightly increased, because a layer resistor of a high energy implanted subcollector (about 100 ohm/sq) can be higher than the one of a conventional subcollector (about 30 ohm/sq) due to a possibly less doping. This effect, however, can be compensated by reducing the resistance of the collector contact to the collector due to the lower thickness of the second semiconductor layer (epitaxial thickness). Above that, the junction area in the HF transistor between the SIC 301 and the buried first semiconductor layer 203 (buried subcollector) is smaller than it is the case with conventional structures. The HF transistor has a continuous buried layer with typically 30 ohm/sq.

In FIG. 5, dopant concentrations of the HF transistor (a) and the HV transistor (b) are illustrated according to the conventional integration concept. On the abscissa, a principle cut through the layers of a semiconductor structure is illustrated, beginning with E: emitter, B: base, flat SIC, retrograded deeper SIC and a buried layer, and in FIG. 5b beginning with E: emitter, B: base, the epitaxial layer and the buried layer. On the respective ordinate, a doping concentration of the respective doping is illustrated. The implantation profiles illustrated in FIGS. 5a and 5b illustrate the conventional variation of an integration scheme, as it is, for example, illustrated in FIG. 8. The retrograde SIC in the HF transistor serves here for bridging the epi area between the end of the base collector space charge zone and is the least-impedance possible implanted collector terminal.

FIG. 6 illustrates dopant concentrations of the HF transistor (a) and the HV transistor (b) for the inventive concept with a high energy buried layer for the HV transistor. On the abscissa of FIG. 6a, a vertical cut through the inventive layers of the semiconductor structure is illustrated, beginning with E: emitter, B: base, the flat SIC and the buried layer, as it is illustrated, for example in FIG. 3 (HF transistor). The abscissa of the graph illustrated in FIG. 6b illustrates a vertical cut through the layers of the inventive HV transistor beginning with E emitter, B base, epi layer, high-energy buried layer, as it is illustrated, for example, in FIG. 4 (HV transistor). On the respective ordinate, for example, doping concentrations of the respective doping are illustrated.

Producing a semiconductor structure comprises providing the buried first semiconductor layer with a recess formed therein, generating the second semiconductor layer on the buried first semiconductor layer as well as generating the semiconductor area on the second semiconductor layer. In the step of providing, further, the following steps can be performed: depositing an implantation mask on the semiconductor substrate, wherein the implantation mask leaves the recess exposed; implanting the buried first semiconductor layer by using the implantation mask. Above that, after the step of generating the second semiconductor layer, a further implantation mask can be deposited, which leaves a recess exposed, as well as a further semiconductor area in the recess by using the further implantation mask. However, a further implantation mask can be deposited, which leaves the recess exposed and a further semiconductor area can be generated in the recess by using the further implantation mask.

Figure 7:
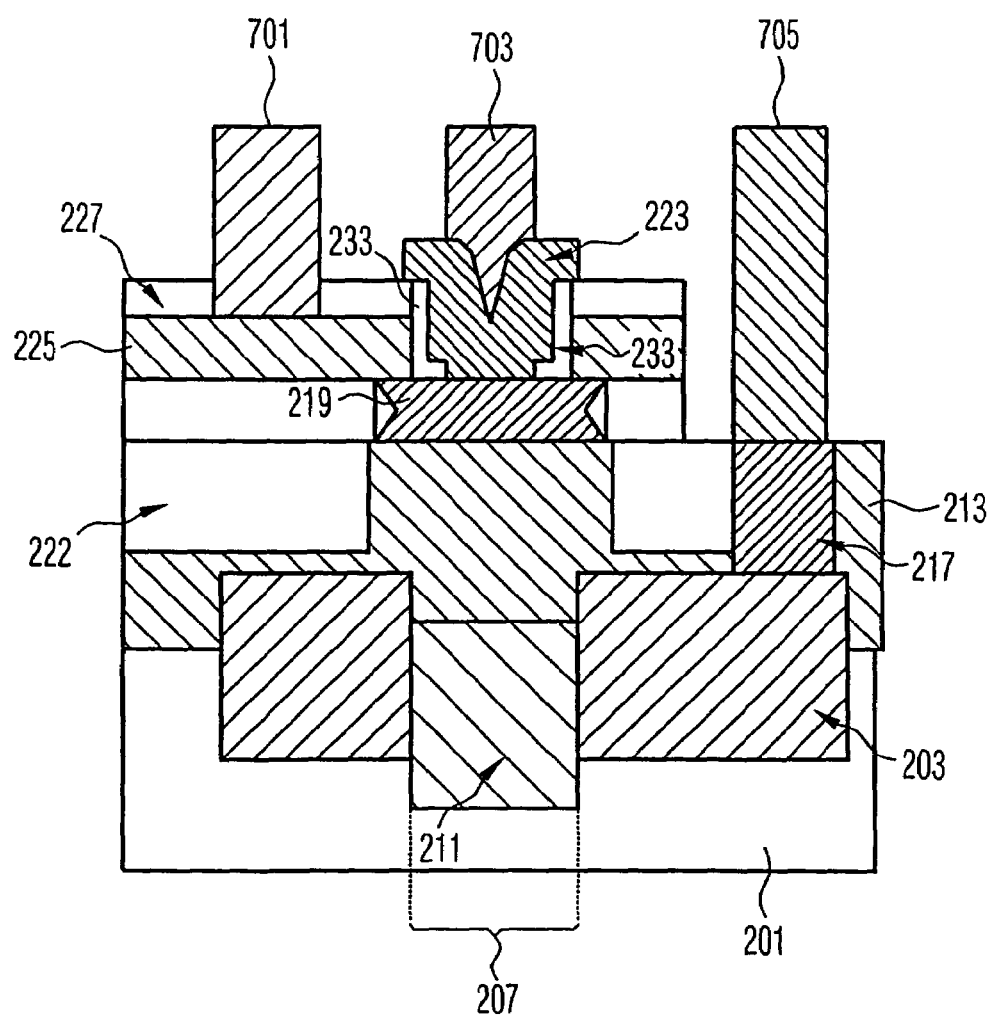
FIG. 7 is a further embodiment of a semiconductor structure according to the present invention.

FIG. 7 shows a further embodiment of a HV transistor according to the present invention, which illustrates the HV concept again.

In contrast to the HV transistor II illustrated in FIG. 2, the HV transistor illustrated in FIG. 7 comprises a base terminal 701, which contacts the base terminal polysilicon 225, and which is lead towards the top through the isolation layer 227, an emitter terminal 703 which contacts the emitter layer 223 and is disposed across the further semiconductor area 211 (local high-energy subcollector), as well as collector terminal 705, which is disposed on the second terminal 217.

The respective subcollector can be generated by an implantation, which is performed with higher energy than the implantation of the buried layer. Thereby, the surface of the subcollector lies deeper than the buried layer.

With the above-described method, the breakdown voltage of the respective HV transistor can be set by a width of the window in the subcollector (buried first semiconductor layer 203), in addition to a change of an implantation energy. Thereby, different breakdown voltages in the respective HV transistor can be set, only by layout measures without increased production costs. This means big advantages with regard to flexibility (different supply voltages or a good optimization of ESD structures) for a possible application of the semiconductor structure produced in that way. The respective breakdown voltage of the respective HV transistor depends on a distance of an edge of the subcollector window to the collector.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for generating a semiconductor structure, comprising:
    a buried first semiconductor layer of a first doping type;
    a second semiconductor layer of the first doping type on the buried semiconductor layer, which is less doped than the buried first semiconductor layer;
    a semiconductor area of a second doping type on the second semiconductor layer, so that a pn junction is formed between the semiconductor area and the second semiconductor layer; and
    a recess present below the semiconductor area in the buried first semiconductor layer, which contains a further semiconductor area of the first doping type, which lies deeper in the substrate than the buried first semiconductor layer, such that the breakdown voltage across the pn junction is higher than if the recess were not provided
    the method comprising,
    providing the buried first semiconductor layer with the recess formed therein,
    performing an implantation for introducing a doping of the first doping type into the recess to generate the further semiconductor area of the first doping type, which lies deeper in the substrate than the buried first layer;
    generating the second semiconductor layer on the buried first semiconductor layer, which is less doped than the buried first semiconductor layer, prior to or after performing the implantation; and
    generating the semiconductor area of the second doping type on the second semiconductor layer in order to form the pn junction.

2. The method according to claim 1, wherein the further semiconductor area is doped equal or less than the buried first semiconductor layer.

3. The method according to claim 1, wherein a portion of the first buried semiconductor layer is formed to include a second recess configured for another bipolar transistor, and wherein the buried first semiconductor layer has recesses of different widths for the bipolar transistors.

4. The method according to claim 1, wherein the semiconductor area is a base, the first buried semiconductor layer a subcollector and the second semiconductor layer a collector of a bipolar transistor.

5. Semiconductor structure according to claim 4, wherein a portion of the buried first semiconductor layer further represents a subcollector for at least another bipolar transistor, wherein the recess is not formed in the portion of the buried first semiconductor layer for the at least another bipolar transistor and the bipolar transistor and the at least another bipolar transistor have different breakdown voltages.

6. The method according to claim 1, wherein the step of providing comprises:
    depositing an implantation mask on a semiconductor substrate, wherein the implantation mask covers the recess;
    implanting the buried first semiconductor layer by using the implantation mask.

7. The method-according to claim 6, further comprising:
    depositing a further implantation mask, which leaves the recess exposed, after the step of providing; and
    generating the further semiconductor area in the recess by using the further implantation mask.

8. A method comprising the steps of:
    providing spaced apart first and second buried first semiconductor layers of a first doping type and a first doping value buried in a substrate, the first buried first semiconductor layer being formed to include a recess therein and acting as a region of a first bipolar transistor, the second buried first semiconductor layer acting as a region of a second bipolar transistor;
    introducing a further semiconductor area of the first doping type in the recess, wherein after the introducing step, the further semiconductor material lies deeper in the substrate than the first buried first semiconductor layer;
    generating a second semiconductor layer of the first doping type on each of the first and second buried first semiconductor layers;

generating a semiconductor area of a second doping type on each of the second semiconductor layers to form pn junctions;

wherein the breakdown voltage across the pn junction of the first bipolar transistor is higher than if the recess were not present; and, wherein the first and second buried first semiconductor layers are provided during a single doping step.

9. The method of claim 8 wherein the doping of the further semiconductor layer is higher than the doping of the second semiconductor layer.

10. The method of claim 9 wherein the doping of the further semiconductor layer is not higher than the doping of the first buried first semiconductor layer.

11. The method of claim 10 wherein the generating a second semiconductor layer step includes generating a portion of the second semiconductor layer so that it extends into the recess.

12. The method of claim 11 wherein the second bipolar transistor has a different breakdown voltage than the first bipolar transistor.

13. The method of claim 12 wherein the provided second buried first semiconductor layer contains no recess.

14. The method of claim 12 wherein the provided second buried semiconductor layer is formed to include a recess having a different width than the recess in the provided first buried first semiconductor layer.

15. The method of claim 12 wherein the first buried first semiconductor layer is a subcollector of the first bipolar transistor.

16. The method of claim 15 wherein the second first buried semiconductor layer is a subcollector of the second bipolar transistor.

* * * * *